US010651291B2

(12) United States Patent
Frougier et al.

(10) Patent No.: US 10,651,291 B2
(45) Date of Patent: May 12, 2020

(54) INNER SPACER FORMATION IN A NANOSHEET FIELD-EFFECT TRANSISTOR

(71) Applicant: GLOBALFOUNDRIES Inc., Grand Cayman (KY)

(72) Inventors: Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 6 days.

(21) Appl. No.: 15/680,467

(22) Filed: Aug. 18, 2017

(65) Prior Publication Data

US 2019/0058052 A1 Feb. 21, 2019

(51) Int. Cl.
*H01L 29/20* (2006.01)
*H01L 29/16* (2006.01)
(Continued)

(52) U.S. Cl.
CPC ........ *H01L 29/66553* (2013.01); *B82Y 10/00* (2013.01); *H01L 21/2236* (2013.01); *H01L 21/31111* (2013.01); *H01L 29/0653* (2013.01); *H01L 29/0665* (2013.01); *H01L 29/0673* (2013.01); *H01L 29/0847* (2013.01);
(Continued)

(58) Field of Classification Search
None
See application file for complete search history.

(56) References Cited

U.S. PATENT DOCUMENTS 9,647,098 B2 5/2017 Obradovic et al.
9,882,026 B2 1/2018 Tapily et al.
(Continued)

FOREIGN PATENT DOCUMENTS

TW 201547016 A 12/2015
TW 201607039 A 2/2016
(Continued)

OTHER PUBLICATIONS

Taiwan Intellectual Property Office, Examination Report issued in Taiwanese Patent Application No. 107117712 dated Dec. 24, 2018.

*Primary Examiner* — Joseph C. Nicely
*Assistant Examiner* — Lamont B Koo
(74) *Attorney, Agent, or Firm* — Thompson Hine LLP; Anthony Canale (57) ABSTRACT

Structures for a nanosheet field-effect transistor and methods for forming a structure for a nanosheet field-effect transistor. A body feature is formed that includes a sacrificial layer arranged vertically between the first and second nanosheet channel layers. The sacrificial layer is laterally recessed at a sidewall of the body feature to expose respective portions of the first and second nanosheet channel layers. A sacrificial spacer is formed by oxidizing a portion of the sacrificial layer at the sidewall of the body feature. Sections of a semiconductor material are epitaxially grown on the exposed portions of the first and second nanosheet channel layers to narrow a gap vertically separating the first and second nanosheet channel layers. The sacrificial spacer is removed to form a cavity between the sections of the semiconductor material and the sacrificial layer. A dielectric spacer is conformally deposited in the cavity.

19 Claims, 7 Drawing Sheets

(51) Int. Cl.
*H01L 29/66* (2006.01)
*H01L 29/06* (2006.01)
*H01L 29/78* (2006.01)
*H01L 29/423* (2006.01)
*H01L 29/10* (2006.01)
*H01L 29/08* (2006.01)
*H01L 21/223* (2006.01)
*H01L 21/311* (2006.01)
*H01L 29/775* (2006.01)
*B82Y 10/00* (2011.01)
*H01L 29/40* (2006.01)
*H01L 29/786* (2006.01)

(52) U.S. Cl.
CPC ........ *H01L 29/1037* (2013.01); *H01L 29/401* (2013.01); *H01L 29/42392* (2013.01); *H01L 29/6653* (2013.01); *H01L 29/6681* (2013.01); *H01L 29/66439* (2013.01); *H01L 29/66772* (2013.01); *H01L 29/775* (2013.01); *H01L 29/7853* (2013.01); *H01L 29/78654* (2013.01); *H01L 29/78696* (2013.01)

(56) References Cited

U.S. PATENT DOCUMENTS

| | | |
|---|---|---|
| 9,899,387 B2 | 2/2018 | Ching et al. |
| 2005/0176186 A1 | 8/2005 | Lee et al. |
| 2011/0133162 A1 | 6/2011 | Bangsaruntip et al. |
| 2012/0146000 A1 | 6/2012 | Bangsaruntip et al. |
| 2014/0339611 A1 | 11/2014 | Leobandung |
| 2015/0340490 A1* | 11/2015 | An ............... H01L 29/785 257/401 |
| 2016/0020305 A1* | 1/2016 | Obradovic ......... H01L 29/7391 257/39 |
| 2017/0053998 A1 | 2/2017 | Kim et al. |

FOREIGN PATENT DOCUMENTS

| | | |
|---|---|---|
| TW | 201611276 A | 3/2016 |
| TW | 201633454 A | 9/2016 |
| TW | 201729340 A | 8/2017 |
| WO | 2015190852 A1 | 12/2015 |

* cited by examiner

INNER SPACER FORMATION IN A NANOSHEET FIELD-EFFECT TRANSISTOR

BACKGROUND

The present invention relates to semiconductor device fabrication and integrated circuits and, more specifically, to structures for a nanosheet field-effect transistor and methods of forming a nanosheet field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

Nanosheet field-effect transistors have been developed as an advanced type of FinFET that may permit additional increases in packing density. The body of a nanosheet field-effect transistor includes multiple nanosheet channel layers stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched using, for example, hydrochloric acid vapor and removed in order to release the nanosheet channel layers, and to provide gate regions for the formation of the gate stack.

Before the nanosheet channel layers are released, source and drain regions are epitaxially grown from the side surfaces of the semiconductor nanosheet layers. Inner spacers are situated between the side surfaces of the sacrificial layers and the epitaxial semiconductor material constituting the source/drain regions. The inner spacers, which are formed of a dielectric material, are structurally intended to isolate the source/drain regions from the gate region during the etching process that releases the nanosheet layers. However, conventional inner spacers may have an associated curvature and may be thinner in regions adjacent to the nanosheet layers. The curvature may arise from diffusion of germanium from the sacrificial layers into the nanosheet channel layers and resulting local variations in the etching rate when etching the cavities in which the dielectric spacers are subsequently formed. The result is that conventional curved inner spacers are prone to breech and leakage that allows the etchant used during nanosheet release to reach and etch the source/drain regions.

SUMMARY

In embodiments of the invention, a method is provided for forming a field-effect transistor. The method includes forming a body feature having a first nanosheet channel layer, a second nanosheet channel layer, and a sacrificial layer arranged vertically between the first nanosheet channel layer and the second nanosheet channel layer. The sacrificial layer is laterally recessed relative to the first nanosheet channel layer and the second nanosheet channel layer at a sidewall of the body feature to expose a portion of the first nanosheet channel layer and a portion of the second nanosheet channel layer. A sacrificial spacer is formed by oxidizing a portion of the sacrificial layer at the sidewall of the body feature. A first section and a second section of a semiconductor material are epitaxially grown respectively on the exposed portion of the first nanosheet channel layer and the exposed portion of the second nanosheet channel layer to narrow a gap vertically separating the first nanosheet channel layer from the second nanosheet channel layer. The sacrificial spacer is removed to form a cavity between the first section and the second section of the semiconductor material and the sacrificial layer. A dielectric spacer is conformally deposited in the cavity.

In embodiments of the invention, a structure is provided for a field-effect transistor. The structure includes a body feature with a first nanosheet channel layer and a second nanosheet channel layer, a functional gate structure with a gate electrode having a section arranged between the first nanosheet channel layer and the second nanosheet channel layer, a first section of a semiconductor material on a portion of the first nanosheet channel layer, and a second section of the semiconductor material on a portion of the second nanosheet channel layer. A dielectric spacer is arranged in a cavity between the first section and the second section of the semiconductor material and the section of the gate electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
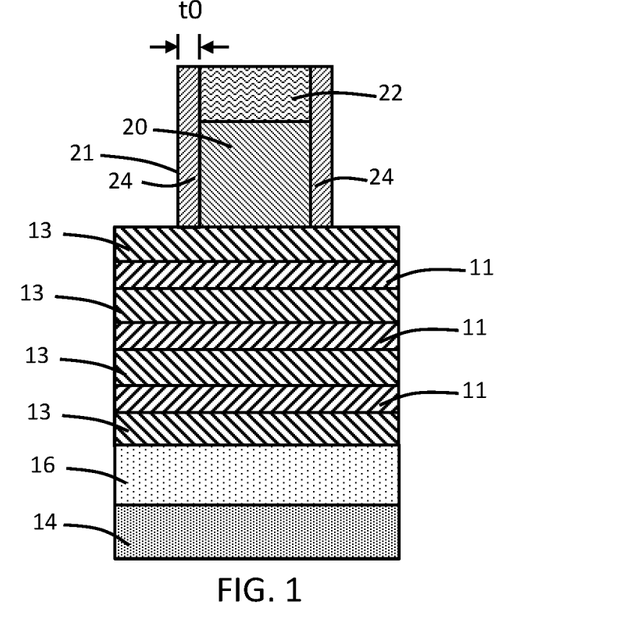
FIGS. 1-9 are cross-sectional views of a device structure at successive stages of a processing method in accordance with embodiments of the invention.

With reference to FIG. 1 and in accordance with embodiments of the invention, semiconductor layers 11 and semiconductor layers 13 are formed in an alternating series to define a layer stack on a substrate 14. The substrate 14 is composed of a semiconductor material, such as single crystal silicon. The semiconductor layers 11, 13 may be sequentially formed by an epitaxial growth process with the composition alternated during growth through a selection of the reactants. The semiconductor layers 11 are composed of a semiconductor material, and the semiconductor layers 13 may be composed of a semiconductor material that is selected to be removed selective to the semiconductor material of the semiconductor layers 11. In an embodiment, the semiconductor layers 11 may be composed of silicon (Si), and the semiconductor layers 13 may be composed of silicon germanium (SiGe) with a germanium content of twenty percent (20%) to sixty percent (60%) that etches at a higher rate than silicon. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The number of semiconductor layers 11 and semiconductor layers 13 may differ from the depicted representative number.

After the semiconductor layers 11, 13 are formed, a dielectric layer 16 is formed that electrically isolates the semiconductor layers 11, 13 from the substrate 14. The dielectric layer 16 may be formed by etching beneath the semiconductor layers 11, 13 and filling with a dielectric material, such as silicon dioxide ($SiO_2$), or a variety of different materials, such as silicon nitride, SiBCN, carbon-doped silicon nitride (SiNC), SiN, SiCO, SiNOC, etc.

A sacrificial gate structure 20 is formed on the top surface of the topmost semiconductor layer 13 of the layer stack. The sacrificial gate structure 20 may be composed of a semiconductor material, such as amorphous silicon, that is deposited by CVD and patterned with reactive ion etching (ME) using a hardmask. The sacrificial gate structure 20 is covered by a dielectric cap 22 located on its top surface.

Dielectric spacers 24 are formed on the top surface of the topmost semiconductor layer 13 of the layer stack at locations adjacent to the vertical sidewalls of the sacrificial gate structure 20. The dielectric spacers 24 have respective sidewalls 21 that may be planar. The dielectric spacers 24 may be composed of a low-k dielectric material, such as silicon-boron-carbon-nitride (SiBCN) or silicon-oxygen-carbon-nitride (SiOCN). The dielectric spacers 24 have a given thickness, to, in a lateral direction perpendicular to the sidewall of the sacrificial gate structure 20.

Figure 2:
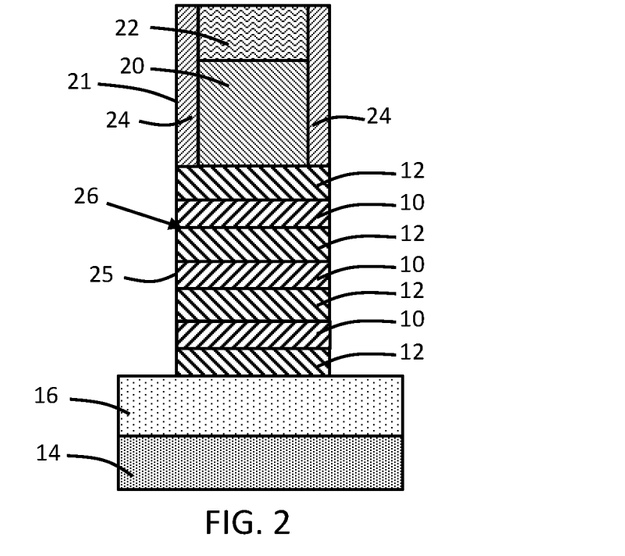

With reference to FIG. 2 in which like reference numerals refer to like features in FIG. 1 and at a subsequent fabrication stage of the processing method, a fin or body feature 26 is formed from the semiconductor layers 11, 13 of the layer stack by an etching process that relies on the sacrificial gate structure 20 and associated dielectric spacers 24 as an etch mask. The self-aligned etching process, which may be a reactive ion etching (RIE) process, relies on one or more etch chemistries to etch through the semiconductor layers 11, 13 and to stop on the dielectric layer 16. The dielectric layer 16 electrically isolates the body feature 26 from the substrate 14.

The body feature 26 includes nanosheet channel layers 10 patterned from the semiconductor layers 11 and sacrificial layers 12 patterned from the semiconductor layers 13. The nanosheet channel layers 10 are arranged to alternate with the sacrificial layers 12 in a vertical direction, and are aligned along the sidewalls 25 of the body feature 26. One of the sacrificial layers 12 is located adjacent to and in direct contact with the dielectric layer 16. Because of the reduced thickness of the dielectric spacers 24, the width of the nanosheet channel layers 10 and sacrificial layers 12 in the body feature 26 is less than the width in conventional processes forming such body features.

Figure 3:
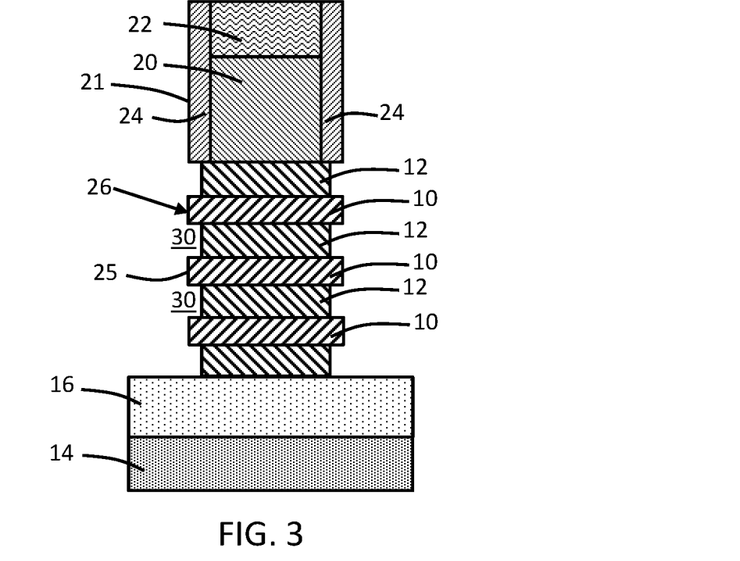

With reference to FIG. 3 in which like reference numerals refer to like features in FIG. 2 and at a subsequent fabrication stage of the processing method, the sacrificial layers 12 are laterally recessed relative to the nanosheet channel layers 10 with a dry or wet isotropic etching process that etches the material constituting the sacrificial layers 12 selective to the material constituting the nanosheet channel layers 10 and the dielectric layer 16. The sidewalls 25 of the body feature 26 are indented by cavities 30 where the surfaces of the sacrificial layers 12 are recessed. The surfaces of the sacrificial layers 12 are located in a vertical direction beneath the dielectric spacers 24. The process etching the sacrificial layers 12 is controlled such that the lateral recessed surfaces do not extend beneath the sacrificial gate structure 20. Peripheral portions of the nanosheet channel layers 10 are exposed at the sidewalls 25 of the body feature 26 by the lateral recessing of the sacrificial layers 12. The lateral recessing of the sacrificial layers 12 places their respective surfaces at the sidewalls 25 interior of the sidewalls 21 of the dielectric spacers 24 but still vertically beneath the dielectric spacers 24. Exposed end portions of the nanosheet channel layers 10 are separated by vertical gaps of dimension, d1, which is equal to the thickness of each sacrificial layer 12.

Figure 4:
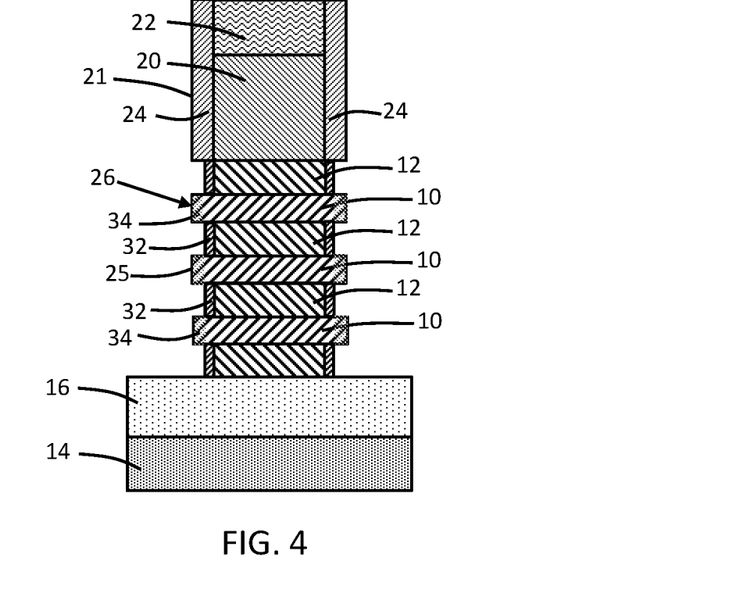

With reference to FIG. 4 in which like reference numerals refer to like features in FIG. 3 and at a subsequent fabrication stage of the processing method, sacrificial spacers 32 are formed inside the cavities 30 (FIG. 3) by selectively oxidizing the exposed surface of each recessed sacrificial layer 12 relative to the nanosheet channel layers 10. The selective oxidization process relies on the compositional difference that exists between the sacrificial layers 12 and the nanosheet channel layers 10. In an embodiment, the selective oxidation process may be conducted at a high pressure and at a low temperature that promotes selective oxidation of silicon-germanium in the sacrificial layers 12 relative to silicon in the nanosheet channel layers 10. The semiconductor material at the side edges of the sacrificial layers 12 is consumed by the selective oxidation process, which narrows the width of the sacrificial layers 12 and may also narrow the cavities 30. The respective surfaces defined by the side edges of the nanosheet channel layers 10 project beyond the sacrificial spacers 32 at the sidewalls 25 of the body feature 26. Following the selective oxidation step, the edges of the sacrificial layers 12 at the respective vertical interfaces with the sacrificial spacers 32 may be aligned vertically with the sidewalls of the sacrificial gate structure 20.

The respective exposed portion of each nanosheet channel layer 10 may be doped to provide a surface layer 34, which may be distributed over a shallow depth beneath the exterior surfaces of the exposed portion. In an embodiment forming an n-type nanosheet field-effect transistor, the surface layer 34 may be doped using, for example, a plasma doping technique with an n-type dopant from Group V of the Periodic Table (e.g., phosphorus (P) and/or arsenic (As)) that imparts n-type electrical conductivity to the constituent semiconductor material. In an embodiment forming a p-type nanosheet field-effect transistor, the surface layer 34 may be doped, for example, using a plasma doping technique with p-type dopant from Group III of the Periodic Table (e.g., boron (B), aluminum (Al), gallium (Ga), and/or indium (In)) that imparts p-type electrical conductivity to the constituent semiconductor material. In an alternative embodiment, the surface layer 34 and its formation may be optional and omitted from the structure and processing method.

Figure 5:
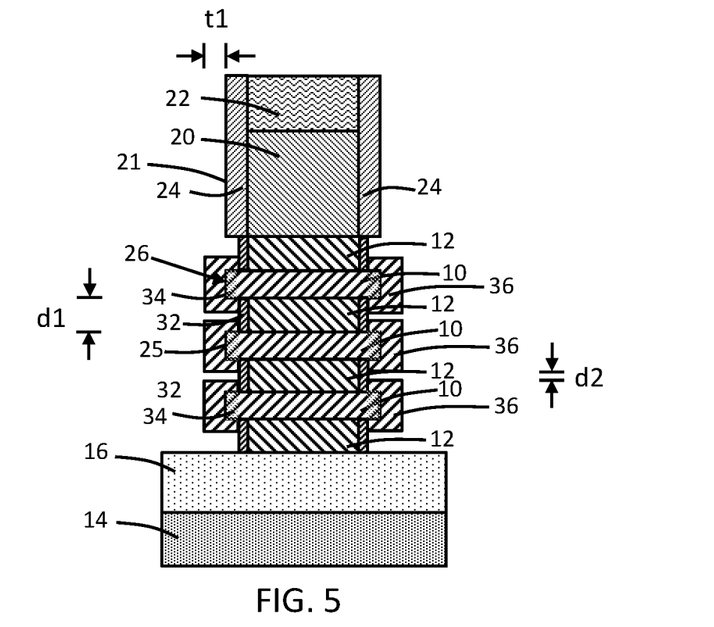

With reference to FIG. 5 in which like reference numerals refer to like features in FIG. 4 and at a subsequent fabrication stage of the processing method, sections 36 of semiconductor material are formed on the exposed surfaces of the nanosheet channel layers 10 at the sidewalls 25 of the body feature 26. The sections 36 may be formed an epitaxial growth process in which the semiconductor material grows from growth seeds provided by the exposed surfaces of the nanosheet channel layers 10. In an embodiment, the sections 36 may be formed by a selective epitaxial growth (SEG) process in which semiconductor material nucleates for epitaxial growth on single-crystal surfaces (e.g., the nanosheet channel layers 10), but does not nucleate for epitaxial growth from insulator surfaces (e.g., the sacrificial spacers 32 and the dielectric layer 16). In the latter regard, the sacrificial spacers 32 cover the sacrificial layers 12 and prevent unwanted epitaxial growth from the sacrificial layers 12.

The semiconductor material constituting the sections 36 may be heavily doped to have either p-type electrical conductivity or n-type electrical conductivity depending on the type of nanosheet field-effect transistor. In an embodiment forming an n-type nanosheet field-effect transistor, the sections 36 may be doped using, for example, a plasma doping technique with an n-type dopant from Group V of the Periodic Table (e.g., phosphorus (P) and/or arsenic (As)) that imparts n-type electrical conductivity to the constituent semiconductor material. In an embodiment forming a p-type nanosheet field-effect transistor, the sections 36 may be doped, for example, using a plasma doping technique with p-type dopant from Group III of the Periodic Table (e.g., boron (B), aluminum (Al), gallium (Ga), and/or indium (In)) that imparts p-type electrical conductivity to the constituent semiconductor material.

The epitaxial growth of the sections 36 is controlled such that the individual sections 36 do not merge with each other, and are separated by vertical gaps with a dimension d2. The vertical gaps separating the sections 36 are smaller than the vertical gaps of dimension, d1, separating the nanosheet channel layers 10. The controlled epitaxial growth results in the sections 36 having a thickness, t1, projecting laterally beyond the vertical plane of the outer sidewall 21 of dielectric spacers 24 that may be equal to the thickness, t0, of the dielectric spacers 24. The addition of the sections 36 to the respective nanosheet channel layers 10 compensates for the dielectric spacers 24 being thinner than conventional dielectric spacers and effectively increases the width of the nanosheet channel layers 10, which extend outwardly at their respective side surfaces past the plane of the sidewalls 21 of the dielectric spacers 24. The sections 36 encapsulate the respective surface layer 34 in the covered portion of each of the nanosheet channel layers 10.

Figure 6:
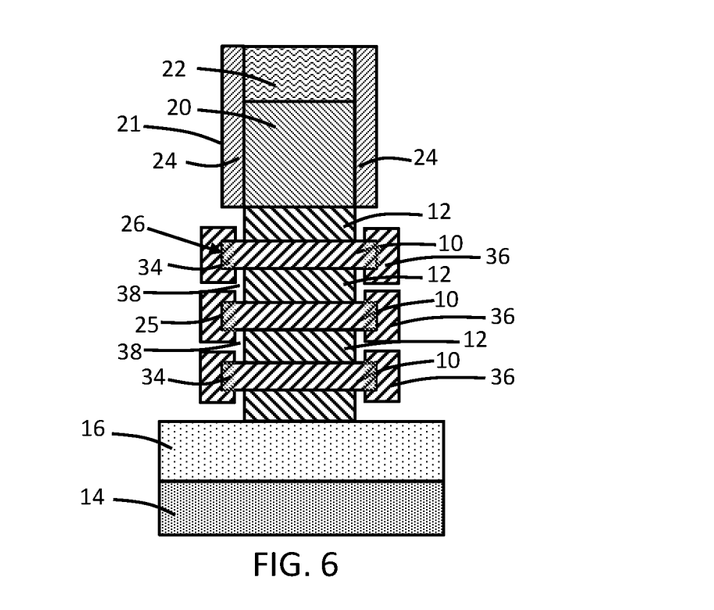

With reference to FIG. 6 in which like reference numerals refer to like features in FIG. 5 and at a subsequent fabrication stage of the processing method, the sacrificial spacers 32 are anisotropically removed selective to the nanosheet channel layers 10, the sacrificial layers 12, and the epitaxial semiconductor sections 36. In an embodiment, the sacrificial spacers 32 may be removed by a wet chemical etching process using buffered hydrofluoric acid (bHF) as an etchant. The removal of the sacrificial spacers 32, which re-exposes the peripheral side surfaces of the sacrificial layers 12 at the sidewalls 25, generates T-shape cavities 38. Each cavity 38 has a section with a smaller height between adjacent pairs of the sections 36 and a section with a larger height between adjacent pairs of the nanosheet channel layers 10. The larger-height sections of the cavities 38 are located adjacent to the sacrificial layers 12, and between the smaller-height sections of the cavities 38 and the sacrificial layers 12.

Figure 7:
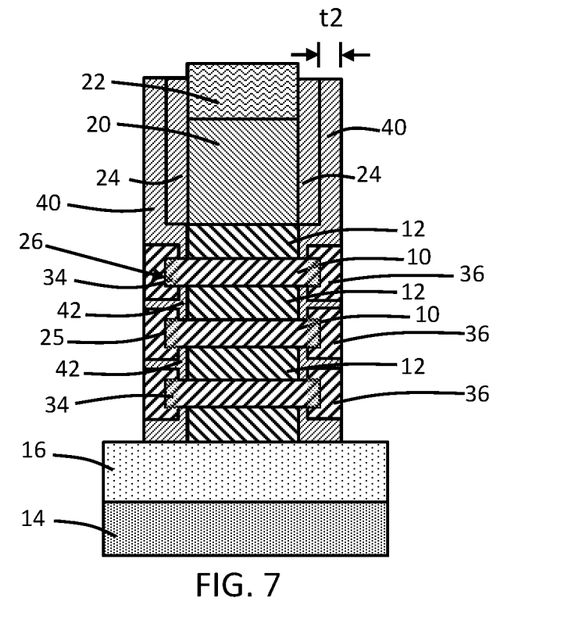
Figure 7A:
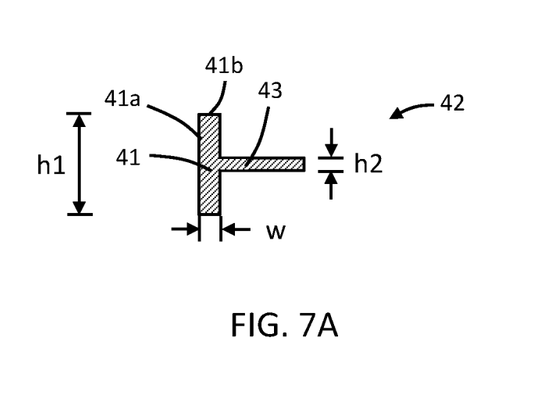
FIG. 7A is an enlarged view of one of the dielectric spacers in FIG. 7.

With reference to FIGS. 7, 7A in which like reference numerals refer to like features in FIG. 6 and at a subsequent fabrication stage of the processing method, inner or dielectric spacers 40 are formed adjacent to the vertical sidewalls of the sacrificial gate structure 20, and inner dielectric spacers 42 are concurrently conformally formed inside both sections of the cavities 38 (FIG. 6). The dielectric spacers 40, 42 may be composed of a low-k dielectric material, such as silicon-boron-carbon-nitride (SiBCN), silicon-oxygen-carbon nitride (SiOCN), or a variety of different materials, such as silicon nitride, SiNC, SiN, SiCO, etc., and may be formed by depositing a conformal layer of the low-k dielectric material and performing a wet etching process and/or dry etching process. The side surfaces of the epitaxial semiconductor sections 36 on the nanosheet channel layers 10 are exposed at the sidewalls 25 of the body feature 26 when the conformal dielectric layer is removed.

The dielectric spacers 24 are arranged between the dielectric spacers 40 and the sacrificial gate structure 20. The dielectric spacers 40 have a given thickness, t2, in a direction perpendicular to the sidewall of the sacrificial gate structure 20 and clad the dielectric spacers 24.

The shape of the dielectric spacers 42 may conform to the T-shape of the cavities 38 and likewise adopt the T-shape with multiple sections of different dimensions. As best shown in FIG. 7A, each dielectric spacer 42 includes a section 41 having a dimension or height, h1, that is arranged adjacent to one of the sacrificial layers 12 and a section 43 having a dimension or height, h2, that is arranged between an adjacent pair of epitaxial semiconductor sections 36. The height of the section 41 is greater than the height of section 43 in which the respective heights are measured in a vertical direction. Each section 41 is arranged between the epitaxial semiconductor sections 36 and the sacrificial layers 12.

The dielectric spacers 42 may be formed by pinch-off of the conformal dielectric layer as the cavities 38 are filled. The sections 41, 43 of the dielectric spacers 42 may be constituted by solid dielectric material, or one or both of the sections 41, 43 may include an air gap (not shown) that is encapsulated during pinch off. The section 41 has a rectangular shape that reflects the corresponding rectangular shape of the cavity 38 in which it is formed. Section 41 includes surfaces 41a, 41b that may be planar and that may intersect at right-angle edges and corners. The surfaces 41a, 41b lack the curvature and the associated non-uniform height and thickness that is associated with dielectric spacers cladding sacrificial gate structures during a conventional process forming a nanosheet field-effect transistor.

Figure 8:
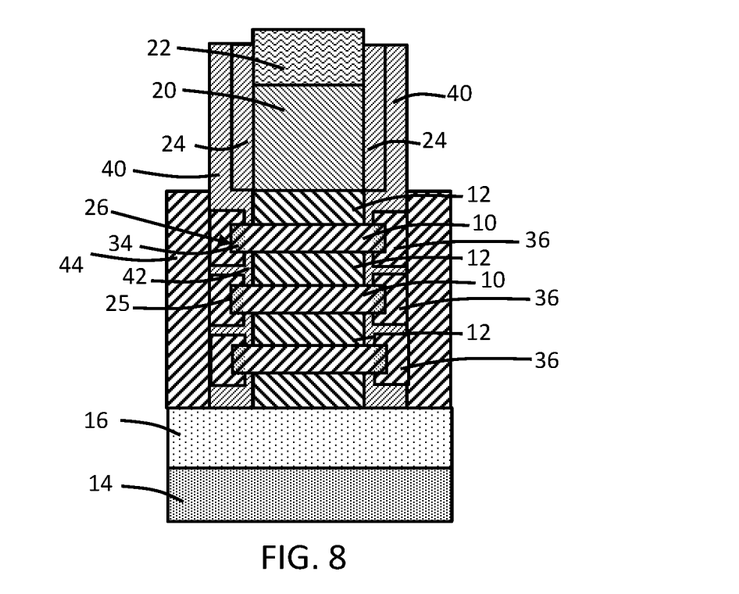

With reference to FIG. 8 in which like reference numerals refer to like features in FIG. 7 and at a subsequent fabrication stage of the processing method, source/drain regions 44 are formed adjacent to the sidewalls 25 of the body feature 26. As used herein, the term "source/drain region" means a doped region of semiconductor material that can function as either a source or a drain of a nanosheet field-effect transistor. The source/drain regions 44 are connected by the epitaxial semiconductor sections 36 with the nanosheet channel layers 10 and are physically isolated from the sacrificial layers 12 by the dielectric spacers 42. The source/drain regions 44 are electrically isolated from the substrate 14 by the dielectric layer 16.

The source/drain regions 44 are formed by an epitaxial growth process in which the semiconductor material grows laterally from growth seeds provided by the epitaxial semiconductor sections 36 appended to the nanosheet channel layers 10. The semiconductor material constituting the source/drain regions 44 may be heavily doped to have either p-type electrical conductivity or n-type electrical conductivity depending on the type of nanosheet field-effect transistor. In an embodiment, the source/drain regions 44 may be formed by a selective epitaxial growth (SEG) process in which semiconductor material nucleates for epitaxial growth on single crystal surfaces (e.g., the epitaxial semiconductor sections 36 on the nanosheet channel layers 10), but does not nucleate for epitaxial growth from insulator surfaces (e.g., the dielectric layer 16). The exposed surfaces of the epitaxial semiconductor sections 36 on the nanosheet channel layers 10 present a larger cross-sectional area for the growth of the source/drain regions 44 than the cross-sectional area of the side surfaces of the nanosheet channel layers 10, which may improve the nucleation and growth of the epitaxial semiconductor material constituting the source/drain regions 44.

Figure 9:
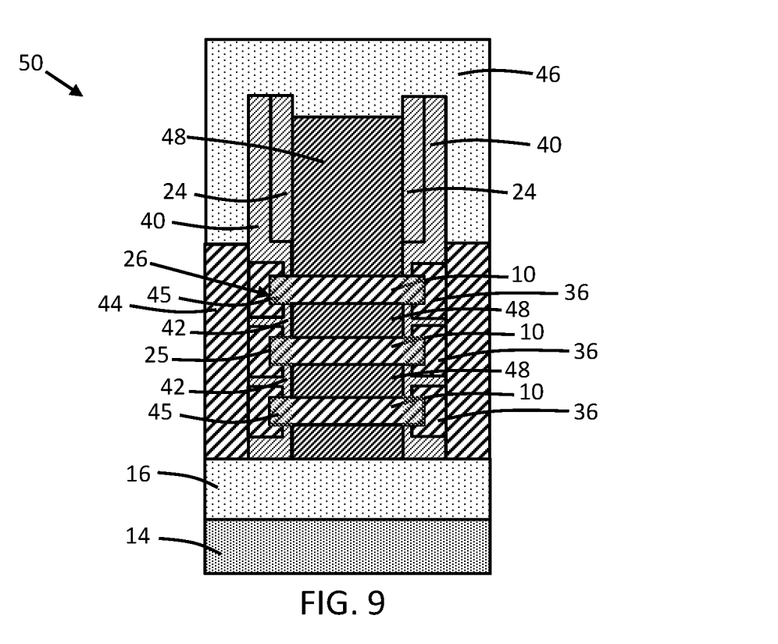

With reference to FIG. 9 in which like reference numerals refer to like features in FIG. 8 and at a subsequent fabrication stage of the processing method, dopant from the epitaxial semiconductor sections 36 and dopant from the optional surface layers 34 may be driven by diffusion inward beneath the dielectric spacers 42 and into the edges of the nanosheet channel layers 10 to provide extensions 45 between the nanosheet channel layers 10 and the epitaxial semiconductor sections 36 and source/drain regions 44. The dopant drive-in may be provided by, for example, rapid thermal processing or a laser anneal. After activation, the dopant operates to reduce the electrical resistance of the semiconductor material of the extensions 45 and, along with the epitaxial semiconductor sections 36, the extensions 45 provide paths of low electrical resistance between the source/drain regions 44 and the nanosheet channel layers 10.

A dielectric layer 46 composed of a dielectric material, such as silicon dioxide ($SiO_2$), may be deposited and planarized to remove the dielectric cap 22 and expose the sacrificial gate structure 20. The sacrificial gate structure 20 and sacrificial layers 12 may be sequentially removed with one or more etching processes that are selective to the nanosheet channel layers 10. The sacrificial gate structure 20 and then the sacrificial layers 12 may be etched and removed using, for example, hot ammonia and/or hydrochloric acid vapor.

Functional gate structures 48 of a field-effect transistor 50 are conformally formed in the opened spaces surrounding each of the nanosheet channel layers 10 as part of a replacement gate process. The functional gate structures 48 may include a thin oxide layer on the surface of the nanosheet channel layers 10, a gate dielectric layer composed of a dielectric material, such as a high-k dielectric, and a metal gate electrode. The gate dielectric layer is arranged between the metal gate electrode and the thin oxide layer on the exterior surface of the nanosheet channel layers 10. The metal gate electrode includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a field-effect transistor.

The dielectric spacers 42 function to mask and hermetically seal the source/drain regions 44 from the etching process removing the sacrificial layers 12 to release the nanosheet channel layers 10. The process forming the dielectric spacers 42 only partially relies on the indentations (i.e., the cavities 30) from the lateral recessing of the sacrificial layers 12. In contrast with conventional inner spacer formation processes, a portion of the space holding the dielectric spacers 42 is provided by the formation and removal of the sacrificial spacers 32. The result is that the dielectric spacers 42, when formed by the deposition of the conformal dielectric layer that fills the cavities 38, adopt the geometrical shape (i.e., a box or rectangular shape) of the space from which the sacrificial spacers 32 are removed and, therefore, lack curved surfaces The nanosheet channel layers 10 of the field-effect transistor 50 are arranged in a vertical stack. Sections of the functional gate structure 48 are located in the spaces formerly occupied by the removed sacrificial layers 12 and surround an exterior surface of the nanosheet channel layers 10 in a gate-all-around arrangement in which sections of the functional gate structure 48 are wrapped about the individual nanosheet channel layers 10. The nanosheet channel layers 10 function as channels for carrier flow that are formed during operation of the field-effect transistor 50. The dielectric spacers 42 are arranged between the sections of the functional gate structure 48 and the sections 36 of the epitaxial semiconductor material.

Middle-of-line (MOL) and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the functional gate structures 48 and source/drain regions 44 of the field-effect transistor 50.

Figure 10:
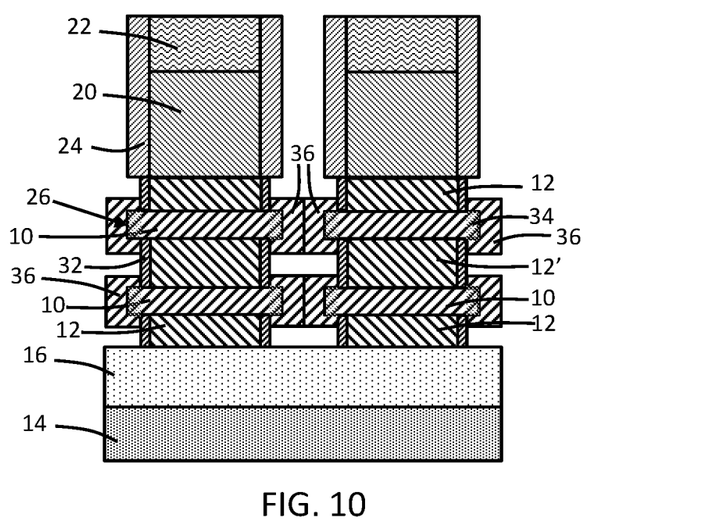
FIGS. 10-13 are cross-sectional views of a device structure at successive stages of a processing method in accordance with embodiments of the invention.

With reference to FIG. 10 in which like reference numerals refer to like features in FIG. 4 and at a subsequent fabrication stage of the processing method, the dielectric spacers 42 may be used in a situation in which multiple body features 26 are formed from the semiconductor layers 11, 13. One or more of the sacrificial layers 12' may have a larger thickness than other of the sacrificial layers 12. The increased thickness of the sacrificial layer 12' may be used to form tall suspensions, which are useful for forming certain types of nanosheet field-effect transistors. In the representative embodiment, the sacrificial layer 12' is centrally located in the layer stack. The sections 36 of epitaxial semiconductor material, which are formed on the surfaces of the exposed portions of the nanosheet channel layers 10, merge together in the space between the body features 26. Adjacent pairs of the sections 36 retain a vertical separation with gaps.

Figure 11:
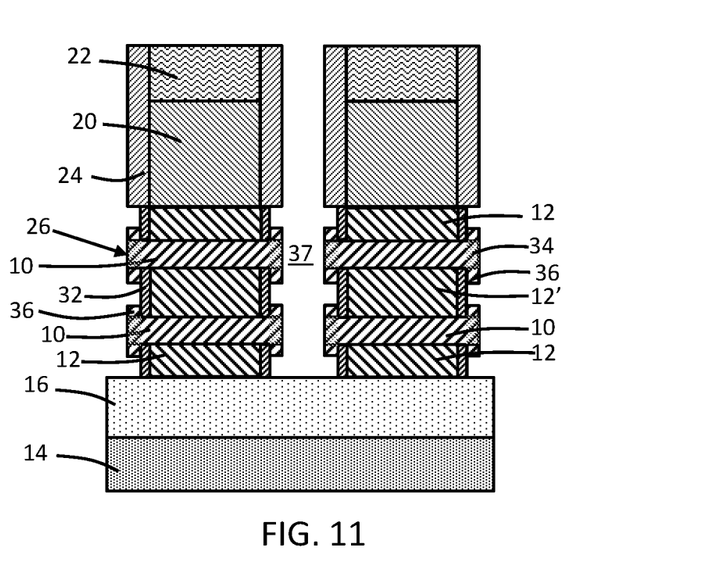

With reference to FIG. 11 in which like reference numerals refer to like features in FIG. 10 and at a subsequent fabrication stage of the processing method, the epitaxial semiconductor sections 36 are etched with an anisotropic etching process, such as reactive ion etching (ME), to form an opening or trench 37 that divides the sections 36 of semiconductor material and eliminates their merged condition in the space between the body features 26. The sacrificial gate structures 20 and dielectric spacers 24 self-align the trench formed by the etching process, which eliminates the merged condition of the epitaxial semiconductor sections 36. Due to the self-alignment of the etching process, each of the epitaxial semiconductor sections 36 has a surface that is coplanar with the surface at the side edge of one of the nanosheet channel layers 10 along the sidewall 25 of the body feature 26.

Figure 12:
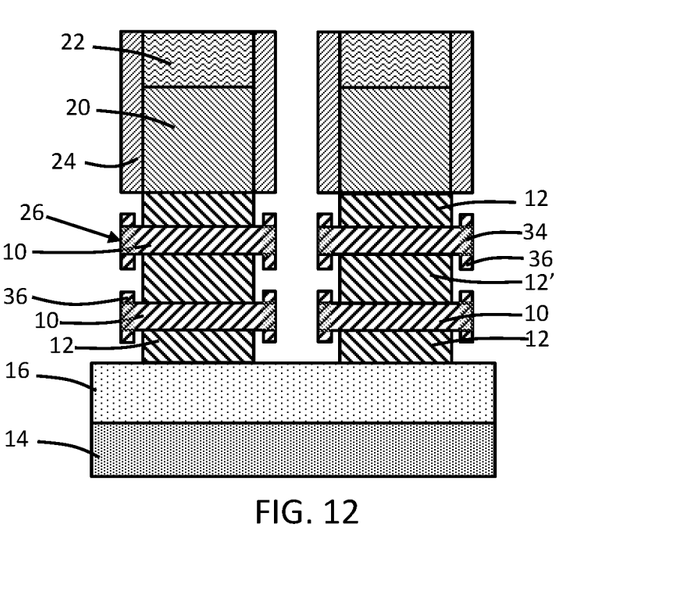

With reference to FIG. 12 in which like reference numerals refer to like features in FIG. 11 and at a subsequent fabrication stage of the processing method, the sacrificial spacers 32 are anisotropically removed selective to the nanosheet channel layers 10, the sacrificial layers 12, and the epitaxial semiconductor sections 36, as described in the context of FIG. 6, to generate the cavities 38.

Figure 13:
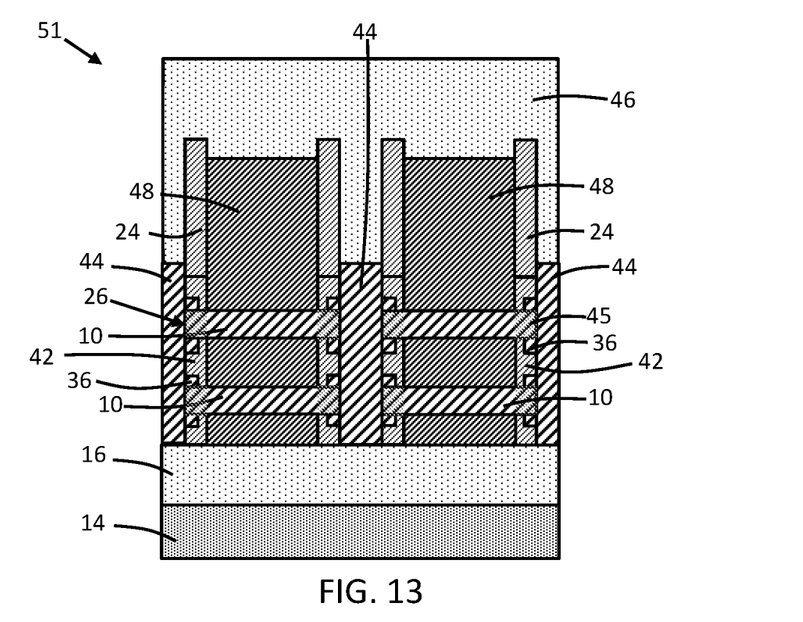

With reference to FIG. 13 in which like reference numerals refer to like features in FIG. 12 and at a subsequent fabrication stage of the processing method, processing continues as described in connection with FIGS. 7-9 to form a nanosheet field-effect transistor 51 that includes multiple body features 26. The field-effect transistor 51 includes a source/drain region 44 that is epitaxially grown in the spacer between the body features 26, as well as the dielectric spacers 42 that enhance the protection of the source/drain regions 44, as described hereinabove, when the sacrificial layers 12, 12' are removed. The processing method may promote the scaling of the contacted gate (poly) pitch (CPP) of the multiple body features 26 while enabling tall suspensions at the scaled CPP. In a conventional inner spacer process, tall suspensions at scaled CPP, as enabled by the sacrificial layer 12' herein, are not feasible because of gate-to-gate pinch-off that could result in shorting. Specifically, the dielectric spacers 42 can be formed by pinch-off during the conformal deposition in cavities 38 associated with the taller sacrificial layer 12' because the epitaxial semiconductor sections 36 effectively narrow the entrance to each cavity 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a field-effect transistor, the method comprising:
    forming a first body feature that includes a first nanosheet channel layer, a second nanosheet channel layer, and a sacrificial layer arranged vertically between the first nanosheet channel layer and the second nanosheet channel layer;
    laterally recessing the sacrificial layer relative to the first nanosheet channel layer and the second nanosheet channel layer at a sidewall of the first body feature to expose a portion of the first nanosheet channel layer and a portion of the second nanosheet channel layer;
    forming a sacrificial spacer by oxidizing a portion of the sacrificial layer at the sidewall of the first body feature;
    epitaxially growing a first section and a second section of a semiconductor material respectively on the portion of the first nanosheet channel layer and the portion of the second nanosheet channel layer to narrow a gap vertically separating the portion of the first nanosheet channel layer from the portion of the second nanosheet channel layer;
    before epitaxially growing the first section and the second section of the semiconductor material, plasma doping the respective portions of the first nanosheet channel layer and the second nanosheet channel layer with a surface layer including a concentration of a dopant;
    removing the sacrificial spacer to form a cavity between the first section and the second section of the semiconductor material and the sacrificial layer; and
    conformally depositing a dielectric spacer in the cavity.

2. The method of claim 1 wherein the sacrificial spacer is formed after laterally recessing the sacrificial layer.

3. The method of claim 1 wherein the sacrificial spacer is removed after epitaxially growing the first section and the second section of the semiconductor material.

4. The method of claim 1 wherein the dielectric spacer is conformally formed in the cavity after removing the sacrificial spacer.

5. The method of claim 1 further comprising:
    annealing to cause the dopant to diffuse into the respective exposed portions of the first nanosheet channel layer and the second nanosheet channel layer to form respective extensions.

6. The method of claim 1 wherein the portion of the sacrificial layer is selectively oxidized relative to the first nanosheet channel layer and the second nanosheet channel layer.

7. The method of claim 1 wherein the sacrificial spacer is arranged vertically between the first nanosheet channel layer and the second nanosheet channel layer.

8. The method of claim 1 wherein the dielectric spacer includes a plurality of planar sidewalls that intersect at right angle corners, and one of the plurality of planar sidewalls of the dielectric spacer is arranged adjacent to the sacrificial layer.

9. The method of claim 1 wherein a second body feature is arranged adjacent to the first body feature, the first section of the semiconductor material extends from the first nanosheet channel layer of the first body feature to a first nanosheet channel layer of the second body feature, the second section of the semiconductor material extends from the second nanosheet channel layer of the first body feature to a second nanosheet channel layer of the second body feature, and further comprising:
   etching an opening that extends through the first section and the second section of the semiconductor material that divides the first section and the second section of the semiconductor material.

10. The method of claim 9 further comprising:
   epitaxially growing a source/drain region between the first body feature and the second body feature using the first section and the second section of the semiconductor material as respective growth seeds.

11. The method of claim 1 wherein a gate structure is stacked with the first body feature and includes a first sidewall spacer, and further comprising:
   after removing the sacrificial spacer, forming a second sidewall spacer on the first sidewall spacer.

12. The method of claim 11 wherein the second sidewall spacer is formed when conformally forming the dielectric spacer in the cavity.

13. The method of claim 1 further comprising:
   epitaxially growing a source/drain region using the first section and the second section of the semiconductor material as respective growth seeds.

14. The method of claim 13 further comprising:
   after epitaxially growing the source/drain region, removing the sacrificial layer selective to the first section and the second section of the semiconductor material,
   wherein the dielectric spacer protects the source/drain region when removing the sacrificial layer.

15. A method of forming a field-effect transistor, the method comprising:
   forming a first body feature that includes a first nanosheet channel layer, a second nanosheet channel layer, and a sacrificial layer arranged vertically between the first nanosheet channel layer and the second nanosheet channel layer;
   laterally recessing the sacrificial layer relative to the first nanosheet channel layer and the second nanosheet channel layer at a sidewall of the first body feature to expose a portion of the first nanosheet channel layer and a portion of the second nanosheet channel layer;
   forming a sacrificial spacer by oxidizing a portion of the sacrificial layer at the sidewall of the first body feature;
   epitaxially growing a first section and a second section of a semiconductor material respectively on the portion of the first nanosheet channel layer and the portion of the second nanosheet channel layer to narrow a gap vertically separating the portion of the first nanosheet channel layer from the portion of the second nanosheet channel layer;
   removing the sacrificial spacer to form a cavity between the first section and the second section of the semiconductor material and the sacrificial layer;
   conformally depositing a dielectric spacer in the cavity;
   epitaxially growing a source/drain region using the first section and the second section of the semiconductor material as respective growth seeds; and
   after epitaxially growing the source/drain region, removing the sacrificial layer selective to the first section and the second section of the semiconductor material,
   wherein the dielectric spacer protects the source/drain region when removing the sacrificial layer.

16. The method of claim 15 wherein a gate structure is stacked with the first body feature and includes a first sidewall spacer, and further comprising:
   after removing the sacrificial spacer, forming a second sidewall spacer on the first sidewall spacer.

17. The method of claim 16 wherein the second sidewall spacer is formed when conformally forming the dielectric spacer in the cavity.

18. A method of forming a field-effect transistor, the method comprising:
   forming a first body feature that includes a first nanosheet channel layer, a second nanosheet channel layer, and a sacrificial layer arranged vertically between the first nanosheet channel layer and the second nanosheet channel layer;
   laterally recessing the sacrificial layer relative to the first nanosheet channel layer and the second nanosheet channel layer at a sidewall of the first body feature to expose a portion of the first nanosheet channel layer and a portion of the second nanosheet channel layer;
   forming a sacrificial spacer by oxidizing a portion of the sacrificial layer at the sidewall of the first body feature;
   epitaxially growing a first section and a second section of a semiconductor material respectively on the portion of the first nanosheet channel layer and the portion of the second nanosheet channel layer to narrow a gap vertically separating the portion of the first nanosheet channel layer from the portion of the second nanosheet channel layer;
   removing the sacrificial spacer to form a cavity between the first section and the second section of the semiconductor material and the sacrificial layer; and
   conformally depositing a dielectric spacer in the cavity,
   wherein a gate structure is stacked with the first body feature and includes a first sidewall spacer, and further comprising:
   after removing the sacrificial spacer, forming a second sidewall spacer on the first sidewall spacer.

19. The method of claim 18 wherein the second sidewall spacer is formed when conformally forming the dielectric spacer in the cavity.

* * * * *